United States Patent
Chien

(10) Patent No.: US 6,414,898 B1
(45) Date of Patent: Jul. 2, 2002

(54) METHOD TO REDUCE PEAK CURRENT FOR RAS CYCLE SENSING IN DRAM USING NON-MULTIPLEXED ROW AND COLUMN ADDRESSES TO AVOID DAMAGE TO BATTERY

(75) Inventor: Pien Chien, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/759,907

(22) Filed: Jan. 16, 2001

(51) Int. Cl.[7] .................................................. G11C 8/00
(52) U.S. Cl. ................... 365/230.06; 365/193; 365/233
(58) Field of Search ...................... 365/230.06, 230.03, 365/233, 193, 194, 195, 205, 208

(56) References Cited

U.S. PATENT DOCUMENTS

| | | | | |
|---|---|---|---|---|
| 5,159,572 A | * | 10/1992 | Morton | 365/230.06 |
| 5,457,659 A | * | 10/1995 | Schaefer | 365/222 |
| 5,642,326 A | * | 6/1997 | Sakurai et al. | 365/230.06 |
| 5,719,815 A | * | 2/1998 | Takahashi et al. | 365/222 |
| 5,745,913 A | * | 4/1998 | Pattin et al. | 711/105 |
| 5,778,447 A | * | 7/1998 | Kuddes | 711/169 |
| 5,844,915 A | * | 12/1998 | Saitoh et al. | 371/21.2 |
| 5,862,095 A | * | 1/1999 | Takahashi et al. | 365/222 |
| 6,005,822 A | * | 12/1999 | Kawamura et al. | 365/230.06 |

* cited by examiner

Primary Examiner—David Nelms
Assistant Examiner—Gene N. Auduong
(74) Attorney, Agent, or Firm—George O. Saile; Stephen B. Ackerman; Billy Knowles

(57) ABSTRACT

A decode circuit provides timing and control signals to a DRAM to insure a minimum current surge during activation of bit-lines within the DRAM during a row address strobe (RAS) cycle. Providing the minimum current surge during the RAS cycle prevents damage to a battery attached to a DRAM when the bit-lines of the DRAM are activated, while minimizing the time to access digital data retain within the DRAM array. The decode circuit within a DRAM will receive a digital address word indicating column locations of a plurality of desired digital data bits retained within an array of DRAM memory cells, decode digital address word, and selectively activate bit-lines of said column locations of said plurality of desired digital data bits at a first time and activate all remaining bit-lines at times subsequent to the first time to minimize RAS cycle current. The decode circuit has a decode logic circuit to select one of the column locations that is designated by the digital address date word. The decode circuit additionally has a first timing circuit and at least one second timing circuit. The first timing circuit is connected between the decode logic circuit and the column locations of said array of DRAM cells to activate the selected one column location to be activated at the first time. At least one second timing circuit is connected between the logic circuit and the column locations of said DRAM cells to activate all unselected locations at times subsequent to the first time.

12 Claims, 6 Drawing Sheets

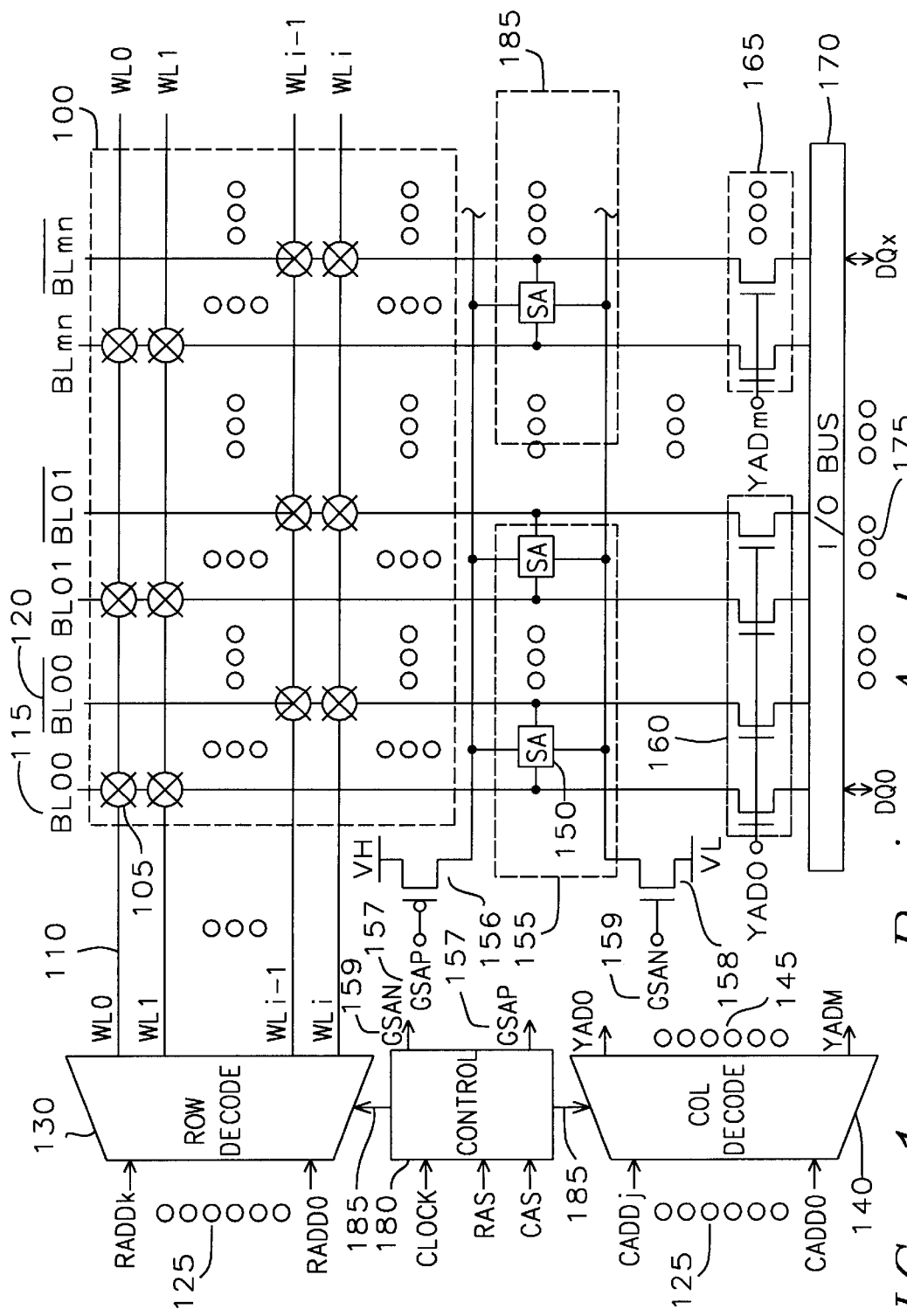
FIG. 1a – Prior Art

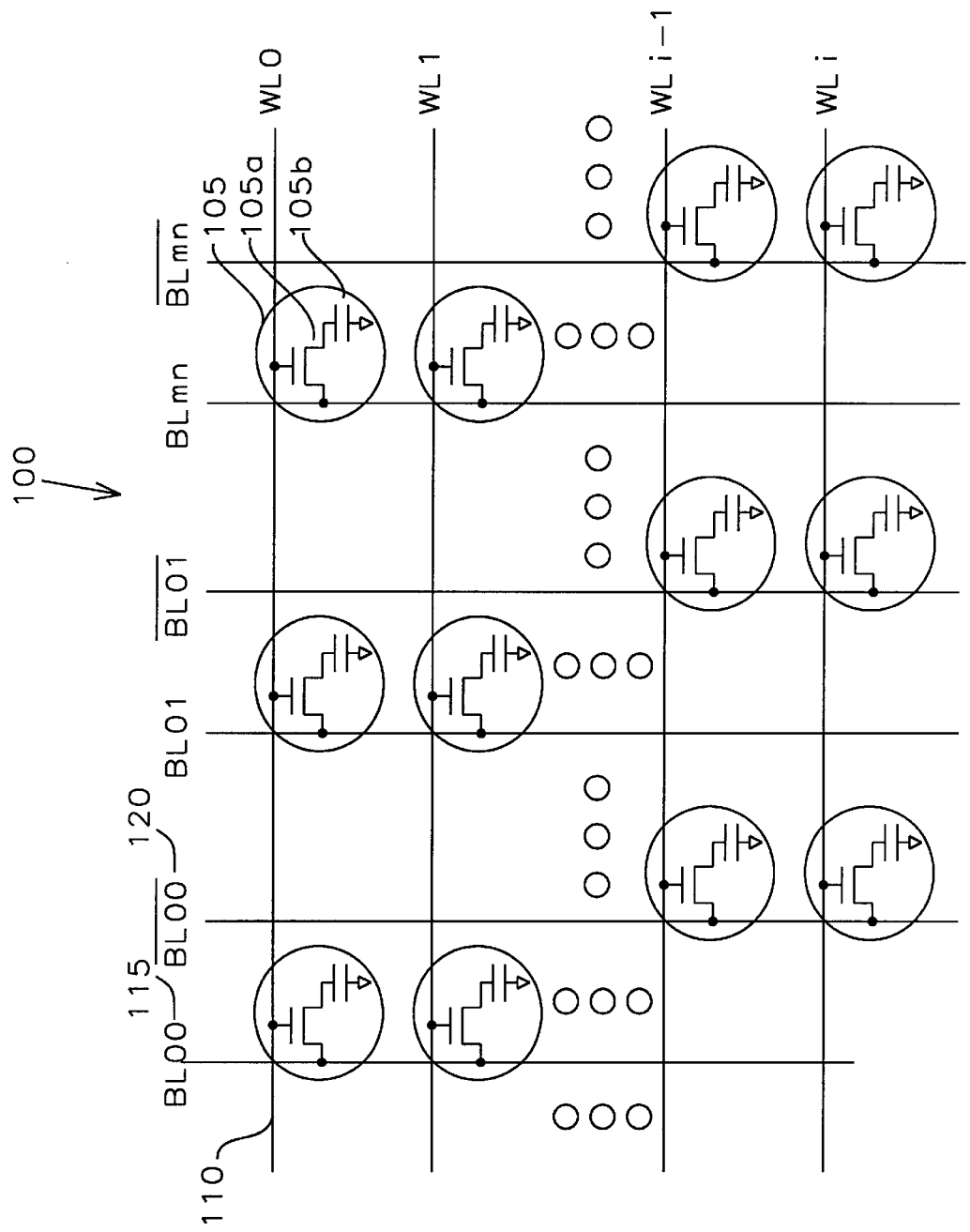
FIG. 1b – Prior Art

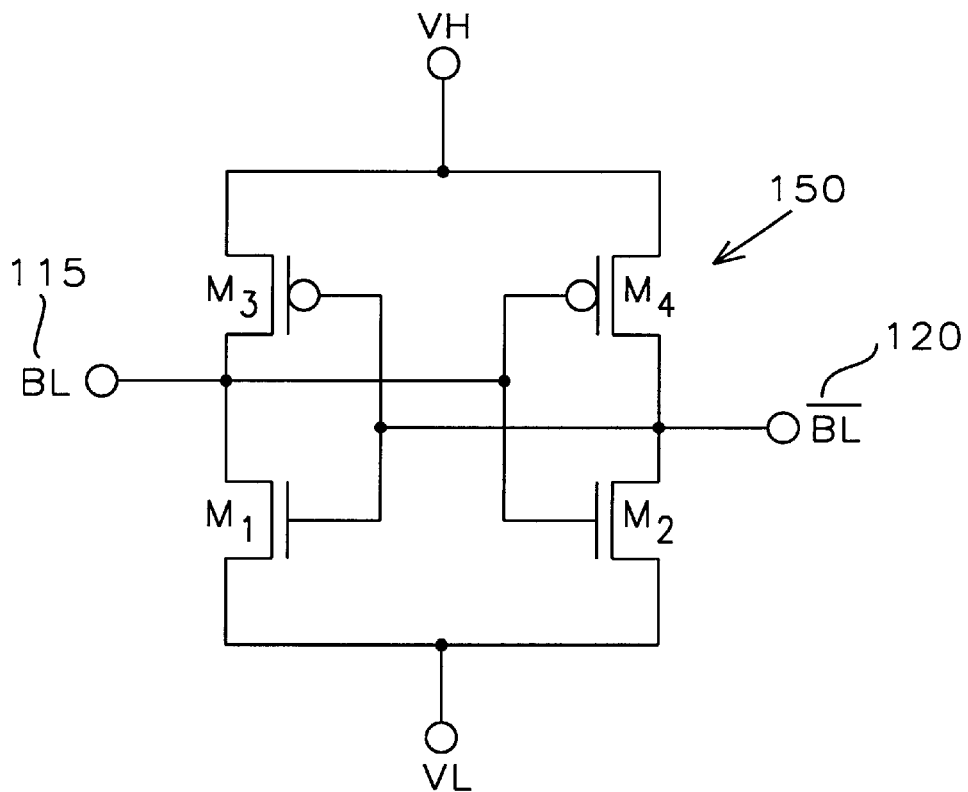
FIG. 1c – Prior Art

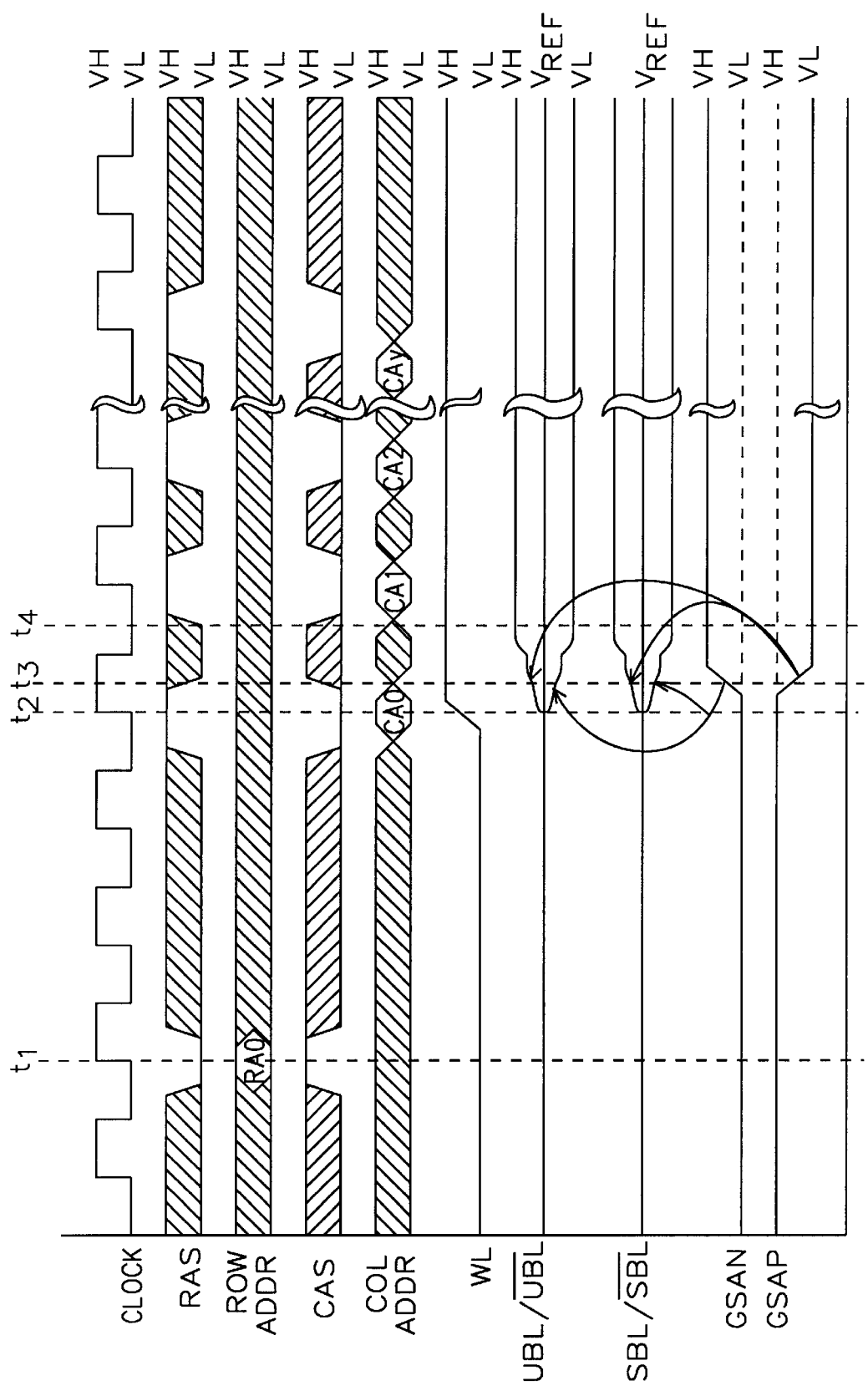
FIG. 2 - Prior Art

METHOD TO REDUCE PEAK CURRENT FOR RAS CYCLE SENSING IN DRAM USING NON-MULTIPLEXED ROW AND COLUMN ADDRESSES TO AVOID DAMAGE TO BATTERY

BACKGROUND OF THE INVENTION

1. Field of the Invention

This invention is related to dynamic random access memory and more particularly this invention is related to methods and circuits to select and activate memory cells of the DRAM.

2. Description of the Related Art

The structure and function of a synchronized dynamic random access memory is described in the Joint Electron Device Engineering Council (JEDEC) standard 21-C section 3.11.5 release 4 and shown schematically in FIG. 1a. An array 100 of memory cells 105 is arranged in rows and columns. FIG. 1b illustrates the detail of the memory array 100. Each memory cell 105 consists of a capacitor C 105b and a pass transistor $M_p$ 105a. The gate of each pass transistor is connected to one of the word-lines WL0, ..., WLi 110 that form the rows of the array 100 of DRAM cells. The drain of the pass transistor $M_p$ 105a is connected to a top plate of the capacitor C 105b. The bottom plate of the capacitor C 105b is connected commonly with all the bottom plates of the cell capacitors of the DRAM array to a reference voltage source. The source of the pass transistor $M_p$ 105a is connected to one of the bit-lines BL00, ..., BLmn 115 or $\overline{BL00}$, ... $\overline{BLmn}$ 120.

A digital data bit is stored as a quantum of electrical charge on the capacitor C 105b. To write or store the digital data bit to one of the memory cells 105, the bit-line BL00, ..., BLmn 115 or $\overline{BL00}$, ... $\overline{BLmn}$ 120 containing the desired memory cell 105 is set to a voltage level indicating the logic state of a digital data bit The word-line WL0, ..., WLi 110 is set to a voltage level sufficient to turn on the pass transistor $M_p$ 105a and the capacitor C 105b is charged to the voltage level indicating the logic state of the digital data bit.

To read or fetch the digital data bit from the desired memory cell 105, the bit-line BL00, ..., BLmn 115 or $\overline{BL00}$, ... $\overline{BLmn}$ 120 is precharged to a reference voltage Vref. The reference voltage Vref is generally one half the voltage level of the power supply voltage. The word-line WL0, ..., WLi 110 containing the desired memory cell 105 is brought to the voltage level sufficient to activate the pass transistor $M_p$ 105a. The charge present on the capacitor C 105b flows to the bit-line BL00, ..., BLmn 115 or $\overline{BL00}$, ... $\overline{BLmn}$ 120 connected to the desired memory cell 105, if the desired memory cell 105 contains a digital data bit indicating a first logic state (1). The flow of charge from the capacitor C 105b increases the voltage level present on the bit-line BL00, ..., BLmn 115 or $\overline{BL00}$, ... $\overline{BLmn}$ 120. However, if the capacitor C 105b is discharged, indicating the memory cell 105 contains a second logic state (0), charge will flow to the capacitor decreasing the voltage level on the bit-line BL00, ..., BLmn 115 or $\overline{BL00}$, ... $\overline{BLmn}$ 120.

Returning now to FIG. 1a, the row digital address word RADD0, ..., RADDk 125 is an input from external circuitry identifying the row location of the array 110 containing the desired memory cell 105. The digital address word RADD0, ..., RADDk 125 is decoded by the row decoder to select the desired word-line WL0, ..., WLi 110.

The column digital address word CADD0, ..., CADDj 135 is a second input from external circuitry identifying the column location of the array 100 containing the desired memory cell 105. The column digital address word CADD0, ..., CADDj 135 is decoded by the column decoder 140 to create the column select signals YAD0, ..., YADm 145. One of the column select signals YAD0, ..., YADm 145 is activated to select the column containing the desired memory cell 105.

The primary bit-lines BL00, ..., BLmn 115 and the complementary bit-lines $\overline{BL00}$, ... $\overline{BLmn}$ 120 are pair-wise connected to one of the sense amplifiers 150. Each sense amplifier detects the change in voltage on one of the bit-lines BL00, ..., BLmn 115 or $\overline{BL00}$, ... $\overline{BLmn}$ 120 that results from the presence or absence of charge present on the memory cell 105 indicating the logic state of the digital data bit. The sense amplifier is a positive feedback amplifier that detects the voltage difference between the primary bit-line BL00, ..., BLmn 115 and complementary bit-line $\overline{BL00}$, ... $\overline{BLmn}$ 120 and forces the primary bit-line BL00, ..., BLmn 115 to the logic state of the memory cell 105 attached to it or the complementary logic state of the memory cell 105 if it is attached to the complementary bit-line $\overline{BL00}$, ... $\overline{BLmn}$ 120. Conversely, the sense amplifier forces the complementary bit-line $\overline{BL00}$, ... $\overline{BLmn}$ 120 to the complement logic state of the selected memory cell 105 connected to the primary bit-line BL00, ..., BLmn 115. However, if the selected memory cell 105 is connected to the complementary bit-line $\overline{BL00}$, ... $\overline{BLmn}$ 120, the sense amplifier forces the complementary bit-line $\overline{BL00}$, ... $\overline{BLmn}$ 120 to the logic state of the selected memory cell 105.

A representative schematic of the sense amplifier 150 is shown in FIG. 1c. If the primary bit-line BL00, ..., BLmn 115 is at a voltage greater than the voltage level of complementary bit-line $\overline{BL00}$, ... $\overline{BLmn}$ 120, the N-type metal oxide semiconductor transistor (NMOS) $M_2$ begins to conduct. This lowers the voltage present on the complementary bit-line $\overline{BL00}$, ... $\overline{BLmn}$ 120 toward the level of the power supply voltage source and begins to force P-type MOS transistor (PMOS) $M_3$ to conduct. The primary bit-line BL00, ..., BLmn 115 is then forced higher toward the voltage level of power supply voltage source VH. This positive feedback continues until the primary bit-line BL00, ..., BLmn 115 has reached the voltage level of the power supply voltage source VH and the complementary bit-line $\overline{BL00}$, ... $\overline{BLmn}$ 120 has reached the level of the power supply voltage source VL. Alternately, if the complementary bit-line $\overline{BL00}$, ... $\overline{BLmn}$ 120 is at a voltage level larger than the voltage level on the primary bit-line BL00, ..., BLmn BL00, ..., BLmn, the NMOS transistor $M_1$ begins to conduct lowering the voltage level of the primary bit-line BL00, ..., BLmn 115 toward the power supply voltage source VL. This causes the PMOS transistor $M_4$ to begin to conduct raising the voltage level of the complementary bit-line $\overline{BL00}$, ... $\overline{BLmn}$ 120 toward the power supply voltage source VH. As described above the positive feedback will ultimately force the primary bit-line BL00, ..., BLmn 115 to the voltage level of the power supply voltage source VL and the complementary bit-line $\overline{BL00}$, ... $\overline{BLmn}$ 120 to the voltage level of the power supply voltage source VH.

During this sensing, amplification, and latching of the level of voltage present on the primary bit-line BL00, ..., BLmn 115 and the complementary bit-line $\overline{BL00}$, ..., $\overline{BLmn}$ 120, a relatively large current flows from the power supply voltage source VH to the bit-lines BL00, ..., BLmn 115 or $\overline{BL00}$, ... $\overline{BLmn}$ 120 and a relatively large current flows from the bit-lines BL00, ..., BLmn 115 or $\overline{BL00}$, ... $\overline{BLmn}$ 120 to the power supply voltage source VL.

Returning to FIG. 1a, it is apparent that when one word-line WL0, ..., WLi 110 is activated, the charge level present on each memory cell 105 of the row connected to the one word-line WL0, ..., WLi 110 is conducted to the bit-lines BL00, ..., BLmn 115 and $\overline{BL00}$, ... $\overline{BLmn}$ 120. Not all of the memory cells 105 on the selected word-line 110 are to be fetched or read during this cycle, but all the memory cells 105 on the selected word-line have to be restored to prevent loss of the digital data bits at the completion of the read cycle. This requires that all the sense amplifiers 150 attached to the array 100 be activated. Activating all the sense amplifiers 150 attached to an array creates a very large current surge from the power supply voltage source VH and into the power supply voltage source VL. In battery powered operations the power supply voltage source VH is the positive terminal of the battery and the power supply voltage source VL is the negative terminal of the battery. The large surge of current from activating all the sense amplifiers can cause damage to the battery.

The power supply voltage source VH and the power supply voltage source VL are connected to the sense amplifiers 150 through the PMOS transistor 156 and the NMOS transistor 158. The PMOS transistor 156 and the NMOS transistor 158 are turned on respectively by the global sense amplifier activation signals GSAP and GSAN. Multiple sense amplifiers 150 are grouped together 155 to allow simultaneous access to multiple memory cells 105. At the completion of the sensing, amplifying, and latching of the charge indicating the as digital data bits present in the memory cells 105 of the selected word-line 110, the desired column select line YAD0 of the column select lines YAD0, ..., YADm 145 turns on the gating NMOS transistors 160 to transfer the logic state present on the desired set of bit-lines BL00, ..., BLmn 115 and $\overline{BL00}$, ... $\overline{BLmn}$ 120 to the 40 bus 170. The I/O bus 170 will amplify and buffer the digital data bits to create the digital output word DQ0, ..., DQX 175 for transfer to external circuitry.

The unselected column select lines YADm keep the transistor 165 connected to keep the undesired bit-lines BL00, ..., BLmn 115 and $\overline{BL00}$, ... $\overline{BLmn}$ 120 disconnected from the I/O bus 170.

At the completion of the read cycle, the memory cells 105 are restored and the selected word-line 110 is deactivated. The column select lines YAD0, ..., YADm 145 are all deactivated to isolate the sense amplifiers 150 and the bit-lines BL00, ..., BLmn 115 and $\overline{BL00}$, ... $\overline{BLmn}$ 120 from the I/O bus 170. The global sense amplifier activation signals GSAN 157 and GSAP 159 are set to a voltage level that will turn off the NMOS transistor 158 and the PMOS transistor 156 to disconnect the sense amplifiers 150 from the power supply voltage source VL and the power supply voltage source VH. Prior to the subsequent operation, the bit-lines BL00, ..., BLmn 115 and $\overline{BL00}$, ... $\overline{BLmn}$ 120 are precharged and equalized to a reference voltage Vref that is usually one half the voltage difference of the power supply voltage sources VH and VL. This precharge and equalization is accomplished by circuitry not shown in FIG. 1a.

Refer now to FIG. 2 for a representative timing diagram of a read or fetch cycle of a synchronous DRAM. The timing control signals RAS, CAS and CLOCK are the external inputs of the SDRAM to the control circuitry 180 of FIG. 1a. At time $t_1$, the RAS and CAS signals are at voltage levels indicating that the row address is received on the external address bus of a multiplexed address SDRAM. The row address is decoded to select the desired word-line as described above. At the time $t_2$, the RAS and CAS signals are at voltage levels indicating the arrivals of the column digital address on the address bus. The bit-lines UBL/$\overline{UBL}$ and SBL/$\overline{SBL}$ are precharged prior to the beginning of the read cycle to the reference voltage Vref as described above. The select word-line is activated and the charge present on the memory cells begins to flow to the bit-lines. The global sense amplifier activation signals GSAP and GSAN are respectively brought to the power supply voltage sources VH and VL at time $t_3$. The activation of the sense amplifiers forces the selected bit-lines SBL/$\overline{SBL}$ and the unselected bit-lines UBL/$\overline{UBL}$ simultaneously to the voltage levels of the power supply voltages VH and VL at time $t_4$. This causes the surge of current into and out of the bit-lines as described above.

The column address is decoded to activate one of the column select lines YAD0, ..., YADm as described above.

The JEDEC standard 21C on page 3.9.5-13 describes non-address multiplexed DRAM requirements. In this description the digital row address word is the high order bits of the input address bus and the digital column address word is the low order bits of the input address bus. The input address bus having both the digital row address word and the digital column address word allows an increase in performance of the SDRAM.

U.S. Pat. Nos. 5,719,815 and 5,862,095 (Takahashi et al.) teach methods and circuits to reduce consumed power within a DRAM by controlling the number of sense amplifier activated during a refresh operation versus the number of sense amplifier activated during a normal read and write operation.

U.S. Pat. No. 5,745,913 (Pattin et al.) describes a DRAM controller for a multiprocessing computer system. The DRAM controller prioritizes the flow of digital data to a bank of memory to maximize the amount of data transferred to a row of a memory array.

U.S. Pat. No. 5,778,447 (Kuddes) discloses a data processing system containing DRAM. The data processing system has a bus structure that automatically generates the row address strobe and column address strobe as well as other timing and control signals necessary to activate DRAM attached to the system bus. Additional signals are used to create the necessary timings and controls of non-DRAM circuitry attached to the system bus.

U.S. Pat. No. 5,642,326 (Sakurai et al.) describes a DRAM having a circuit for controlling the selection of the row decoder and the activation of the sense amplifiers with the externally provided row address strobe. The DRAM further has a word-line control circuit to provide the appropriate electrical voltage levels to activate the pass transistors of the memory cells attached to the word-line and to deactivate the pass transistors of the memory cells after the electrical charge has been sensed and amplified by the sense amplifiers. The DRAM further has thin gate oxide films designed to be subjected to lower voltage fields to improve reliability. The voltage levels of the word-lines are such that the need for leakage current compensation is eliminated. The DRAM, additionally, has reduced time to restore the charges to the memory cells attached to the selected word-lines subsequent to a read operation and a reduced cycle time required for a data writing operation.

U.S. Pat. No. 5,844,915 (Saitoh et al.) describes a method for determining the leakage current of a word-line in a DRAM. The level of the leakage current of the wordline of the DRAM is an indication of the adequacy of the performance of the DRAM and is used during testing subsequent to fabrication of the DRAM.

U.S. Pat. No. 5,457,659 (Schaefer) teaches a DRAM, which is adapted to provide extended data, output upon reception of appropriate logic signals. The DRAM includes a GAS before RAS detection circuit, which controls the output data during a CAS before RAS refresh cycle.

SUMMARY OF THE INVENTION

An object of this invention is to provide a DRAM having a minimum current surge during activation of bit-lines within the DRAM during a row address strobe cycle.

Another object of this invention is to prevent damage to a battery attached to a DRAM when the bit-lines of the DRAM are activated during a row address strobe cycle.

Further, another object of this invention is to minimize the current surge during activation of the bit-lines of the DRAM within a minimum of the time to access digital data retain within the DRAM array during a row address strobe cycle.

To accomplish these and other objects a decode circuit within a DRAM will receive a digital address word indicating column locations of a plurality of desired digital data bits retained within an array of DRAM memory cells, decode digital address word, and selectively activate bit-lines of the column locations of the plurality of desired digital data bits at a first time and activate all remaining bit-lines at times subsequent to the first time to minimize row address strobe cycle current. The decode circuit has a decode logic circuit to select one of the column locations that is designated by the digital address date word. The decode circuit additionally has a first timing circuit and at least one second timing circuit. The first timing circuit is connected between the decode logic circuit and the column locations of the array of DRAM cells to activate the selected one column location to be activated at the first time. The second timing circuit is connected between the logic circuit and the column locations of the DRAM cells to activate all unselected locations at times subsequent to the first time.

To facilitate the operation of the decode circuit the digital address word is received at a row address strobe time.

A BRIEF DESCRIPTION OF THE DRAWINGS

FIG. 1a is a partial schematic drawing of a DRAM of the prior art.

FIG. 1b is a schematic drawing of an array of DRAM cells of the prior art showing the detail of the memory cell.

FIG. 1c is a schematic drawing of a sense amplifier of the prior art.

FIG. 2 is a timing diagram of a DRAM read cycle of the prior art.

DETAILED DESCRIPTION OF THE INVENTION

Figure 3:
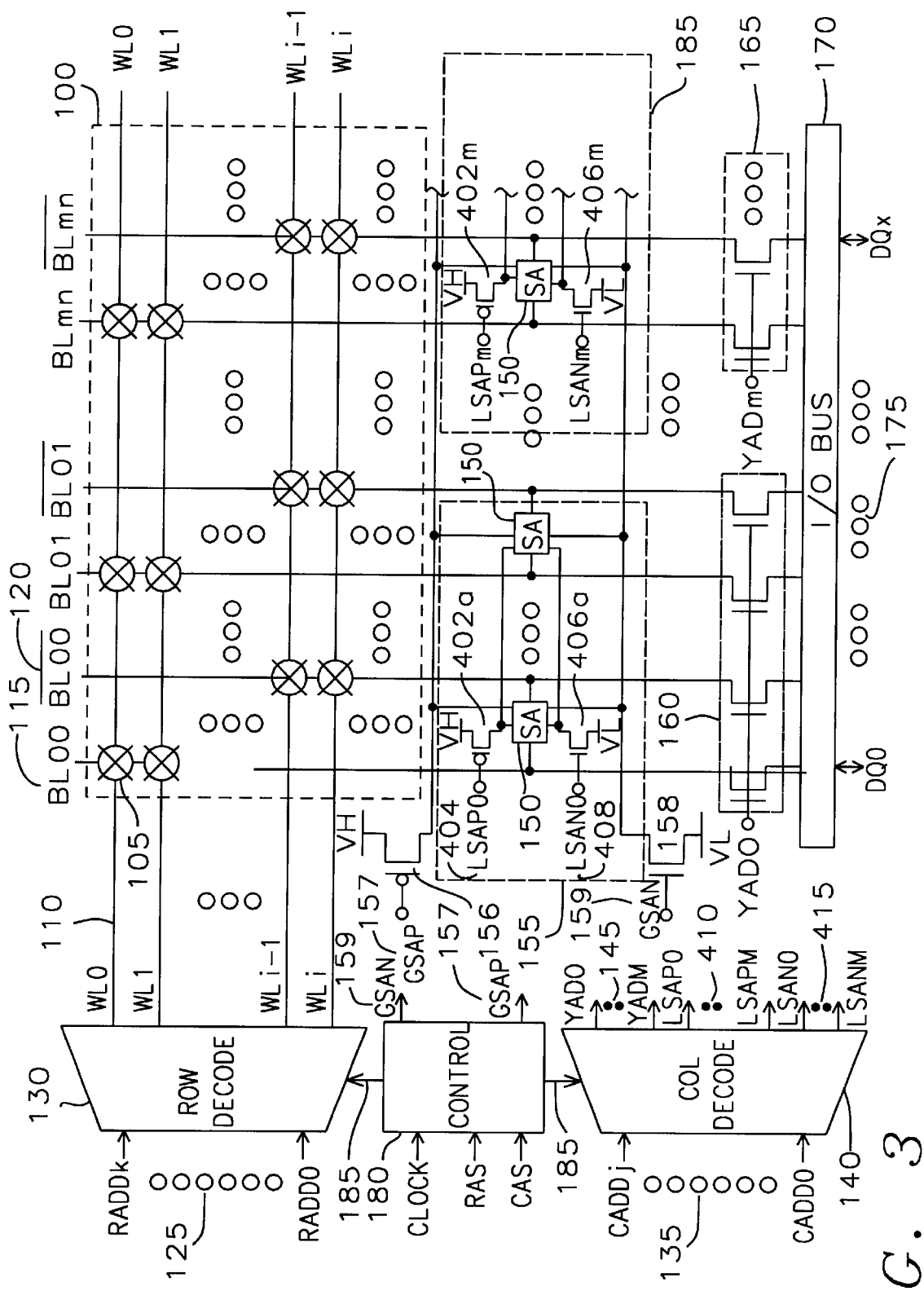
FIG. 3 is a partial schematic drawing of a DRAM of this invention.

FIG. 3 illustrates the structure of the DRAM of this invention. The structure and operation of the memory array is as shown and described in FIG. 1a. The digital row address RADD0, . . . , RADDk is decoded in the row decoder 130 and selects the appropriate word-line WL0, . . . , WLi 110 to be activated to turn on the pass transistors of the memory cells 105.

The sense amplifiers 150 are connected between the primary bit-lines BL00, . . . , BLmn 115 and the complementary bit-lines $\overline{BL00}$, . . . $\overline{BLmn}$ 120. The sense amplifiers 150 again function as described in FIG. 1c.

The digital column address word CADD0, . . . , CADDj 135 are decoded in the column decode circuit to activate the column select lines YAD0, . . . , YADm 145 and the local sense amplifier activation signals LSAP0, . . . , LSAPm 410 and LSAN0, . . . , LSANm 415. The column select lines YAD0, . . . , YADm 145 selectively activate one of the groups of NMOS transistors 160 or 165 to transfer the voltage levels present between the primary bit-lines BL00, . . . , BLmn 115 and the complementary bit-lines $\overline{BL00}$, . . . $\overline{BLmn}$ 120 indicating the logic state of the memory cells 105 connected to the selected word-line 110 to the input/output bus 170 as described above.

The local sense amplifier activation signals LSAPD, . . . , LSAPm 410 and LSAN0, . . . , LSANm 415 are connected respectively to the PMOS transistors 402a, . . . , 402m and the NMOS transistors 406a, . . . , 406m. The PMOS transistors 402a, . . . , 402m provide the connection of the power supply voltage source VH to the sense amplifiers 150 and the NMOS transistors 406a, . . . , 406m provide the connection of the power supply voltage source VL to the sense amplifiers 150. The sense amplifiers 150 are grouped together 155 and 185 to allow access of the data stored on multiple memory cells to be transferred to the I/O Bus 170 by the activation of the appropriate column select line YAD0, . . . , YADm 145. Further, the activation of the sense amplifiers 150 within a group 155 or 185 of sense amplifiers by the local sense activation signal LSAPO, . . . , LSAPm 410 and LSAN0, . . . , LSANm 415 allows the voltage levels present on the bit-lines BL00, . . . , BLmn 115 and $\overline{BL00}$, . . . $\overline{BLmn}$ 120 to be sensed overtime. This then minimizes the current surge of the sense amplifiers.

The global sense amplifier activation signals GSAP 157 and GSAN 159 are connected respectively to the PMOS transistors 156 and the NMOS transistors 158 to allow the global activation of the sense amplifiers 150 in applications insensitive to the current surge of the sense amplifiers 150.

The timings of the activation of the selected word-line 110, the global sense amplifier activation signals GSAP 157 and GSAN 159 the local sense amplifier activation signals LSAP0, . . . , LSAPm 410 and LSAN0, . . . , LSANm 415, and the column select lines YAD0, . . . , YADm 145 are established as a function of the clock, the row address strobe RAS, and the column address strobe CAS within the control circuitry 180. The local sense amplifier activation signals LSAP0, . . . , LSAPm 410 and LSAN0, . . . , LSANm 415 are derived as a function of the column select signals YAD0, . . . , YADm 145 within the column decode circuit 140.

Figure 4:
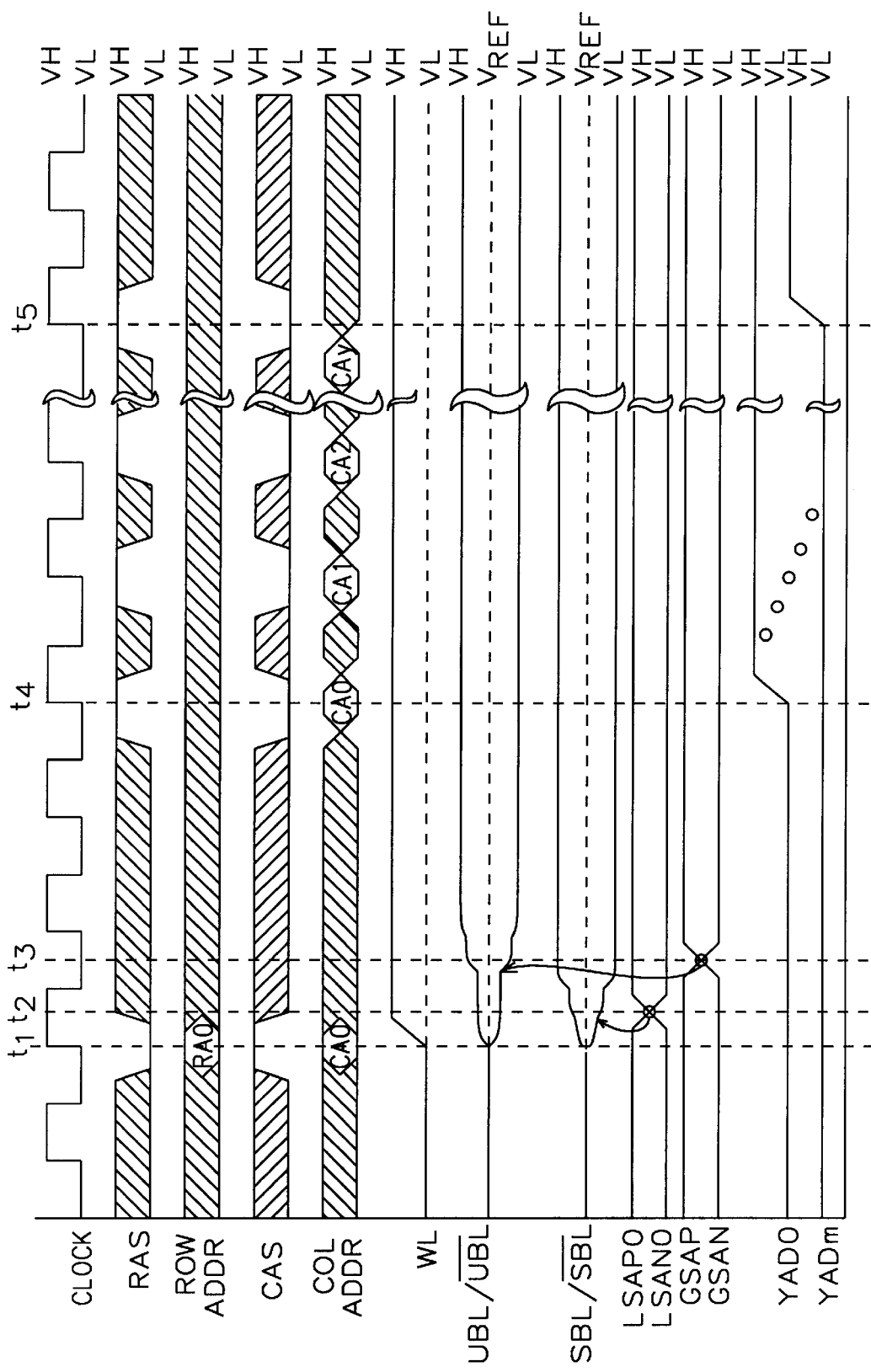
FIG. 4 is a timing diagram of a DRAM read cycle of this invention.

Refer now to FIG. 4 for a discussion of the timing of the DRAM of this invention. The structure of the DRAM of this invention has non-address multiplexing as described in JEDEC standard 21C page 3.9.5-13. The row address strobe (RAS) has assumed its active logic state (0) and the column address strobe (CAS) has assumed its inactive logic state (1). The row address RA0 is received and-decoded as described above to activate the selected word-line WL. The charge level present on the capacitor of each memory cell attached to the word-lines flows to the bit-lines for capacitors charged to the voltage level of the power supply voltage source VH and flows from the bit-lines for capacitors discharged to the voltage level of the power supply voltage source VL. The voltage level of the bit-lines UBL/$\overline{UBL}$ and SBL/$\overline{SBL}$ begins to move from voltage level VREF. The voltage level VREF is generally the voltage level that is one half the difference of the power supply voltage source VH and the power supply voltage source VL.

The digital column address word CA0 is presented simultaneously with the digital row address word RA0. The digital column address word CA0 is decoded and the local sense amplifier activation signals LSAPO 404 and LSAN0 408 are activated at time $t_2$ to turn on respectively the PMOS transistors 402a and the NMOS transistors 406a, which connect to the sense amplifiers 150 within the group 155 of sense amplifiers of FIG. 3. The sense amplifiers sense and amplify the voltage levels on the select bit-lines SBL/$\overline{SBL}$ until they reach of the voltage levels of either the power supply voltage source VH or the power supply voltage source VL.

At some time $t_3$ subsequent to the selected bit-lines SBL/$\overline{SBL}$ reaching the voltage level representing the logic state stored within the desired memory cells attached to the selected word-line WL, the global sense amplifier activation signals GSAP 156 and GSAN 157 are brought to the voltage levels necessary to turn on respectively the PMOS transistor 156 and the NMOS transistor 158 to connect the power supply voltage source VH and the power supply voltage source VL to all the sense amplifiers 150. The unselected sense amplifiers, when activated, sense and amplify the voltage levels on those bit-lines UBL/$\overline{UBL}$ not connected to the desired memory cells until the unselected bit-lines UBL/$\overline{UBL}$ have achieved the voltage level of either the power supply voltage source VH or the power supply voltage source VL.

By activating the selected bit-lines SBL/$\overline{SBL}$ at a time prior to activating the unselected bit-lines UBL/$\overline{UBL}$, the current surge as described above is reduced to prevent damage to a battery connected between power supply voltage source VH and the power supply voltage source VL.

While the primary embodiment of this invention shows the selected bit-lines SBL/$\overline{SBL}$ being activated prior to simultaneously activating all the unselected bit-lines UBL/$\overline{UBL}$, it is in keeping with this invention to have the bit-lines selected in smaller groups to further decrease the current surge.

At time $t_4$ the row address strobe RAS is brought to its inactive logic state and the column address strobe CAS is brought to its active logic state, the first column address CA0 is decoded and the first column select line YAD0 is activated to turn on the NMOS transistors 160 and transfer the selected bit-lines to the I/O bus circuit 170. To fetch or read the remaining columns present on the array 100, the column addresses CA1, . . . , CAy are received and decoded to activate the remaining NMOS transistors to connect remaining groups of bit-lines to the I/O bus 170. At time $t_5$, the final-column address CAy is decoded to activate the column select line YADm to turn on the NMOS transistors 165 to connect the bit-lines BLmn/$\overline{BLmn}$ to the I/O bus 170.

While this invention has been particularly shown and described with reference to the preferred embodiments thereof, it will be understood by those skilled in the art that various changes in form and details may be made without departing from the spirit and scope of the invention.

The invention claimed is:

1. A decode circuit to receive a digital address word indicating column locations of a plurality of desired digital data bits retained within an array of DRAM memory cells, decode digital address word, and selectively activate sense amplifiers connected to bit-lines of said column locations of said plurality of desired digital data bits at a first time and activate all sense amplifier connected to all remaining bit-lines at times subsequent to the first time to minimize row address strobe cycle current, whereby said decode circuit comprises:

a decode logic circuit to select one of the column locations that is designated by the digital address date word;

a first sense line activation circuit connected to the sense amplifiers of the bit lines to selectively activate said sense amplifiers at the first time;

a second sense line activation circuit connected to all the sense amplifiers connected to all bit-lines of said array to activate the sense amplifiers connected to the remaining bit-lines at the remaining times subsequent to the first time;

a first timing circuit in communication with the decode logic circuit and the first sense line activation circuit to activate the first sense line activation circuit connected to the selected column locations to be activated at the first time; and at least one second timing circuit in communication with the decode logic circuit and the second sense line activation circuit connected the unselected column locations to activate all unselected column locations at times subsequent to the first time.

2. The decode circuit of claim 1 wherein the digital address word is received at a row address strobe time.

3. The decode circuit of claim 1 wherein the first sense line activation circuit comprises:

a MOS transistor of a first conductivity type having a drain connected to a first power supply voltage source and a source connected to the sense amplifiers of the bit lines to be selectively activated, and a gate connected to the first timing circuit to receive a first activation signal at the first time; and a MOS transistor of a second conductivity type having a drain connected to a second power supply voltage source and a source connected to the sense amplifiers of the bit lines to be selectively activated, and a gate connected to the first timing circuit to receive the first activation signal at the first time.

4. The decode circuit of claim 3 wherein the second sense line activation circuit comprises:

a MOS transistor of a first conductivity type having a drain connected to the first power supply voltage source and a source connected to the sense amplifiers of all bit lines of the array, and a gate connected to the second timing circuit to receive a second activation signal at the times subsequent to the first time; and a MOS transistor of a second conductivity type having a drain connected to a second power supply voltage source and a source connected to the sense amplifiers of all bit lines of the array, and a gate connected to the second timing circuit to receive the second activation signal at the times subsequent to the first time.

5. A DRAM integrated circuit to retain digital bits with an array of memory cells arranged in rows and columns, comprising:

a decode circuit to receive a digital address word indicating column locations of a plurality of desired digital data bits retained within an array of DRAM memory cells, decode digital address word, and selectively activate sense amplifiers connected to bit-lines of said column locations of said plurality of desired digital data bits at a first time and activate sense amplifiers connected to all remaining bit-lines at times subsequent to the first time to minimize row address strobe cycle current whereby said decode circuit comprises:

a first sense line activation circuit connected to the sense amplifiers of the bit lines to selectively activate said sense amplifiers at the first time;

a second sense line activation circuit connected to all the sense amplifiers connected to all bit-lines of said array to activate the sense amplifiers connected to the remaining bit-lines at the remaining times subsequent to the first time;

a decode logic circuit to select one of the column locations that is designated by the digital address date word;

a first timing circuit in communication with the decode logic circuit and first sense line activation circuit to activate the first sense line activation circuit connected to the selected column locations to be activated at the first time; and at least one second timing circuit in communication with the decode logic circuit and the second sense line activation circuit to activate the second sense line activation circuit connected to all unselected column locations at times subsequent to the first time.

6. The DRAM integrated circuit of claim 5 wherein the digital address word is received at a row address strobe time.

7. The DRAM integrated circuit of claim 5 wherein the first sense line activation circuit comprises:

a MOS transistor of a first conductivity type having a drain connected to a first power supply voltage source and a source connected to the sense amplifiers of the bit lines to be selectively activated, and a gate connected to the first timing circuit to receive a first activation signal at the first time; and a MOS transistor of a second conductivity type having a drain connected to a second power supply voltage source and a source connected to the sense amplifiers of the bit lines to be selectively activated, and a gate connected to the first timing circuit to receive the first activation signal at the first time.

8. The DRAM integrated circuit of claim 7 wherein the second sense line activation circuit comprises:

a MOS transistor of a first conductivity type having a drain connected to the first power supply voltage source and a source connected to the sense amplifiers of all bit lines of the array, and a gate connected to the second timing circuit to receive a second activation signal at the times subsequent to the first time; and a MOS transistor of a second conductivity type having a drain connected to a second power supply voltage source and a source connected to the sense amplifiers of all bit lines of the array, and a gate connected to the second timing circuit to receive the second activation signal at the times subsequent to the first time.

9. A method to activate bit-lines of columns of an array of memory cells so as to minimize a row address strobe cycle current, comprising the steps of:

fetching a digital column address word indicating desired column locations that are to be accessed;

activating sense amplifiers of bit-lines of the desired column locations at a first time; and activating sense amplifiers of bit-lines of undesired column locations in at least one group at times subsequent to the first time.

10. The method of claim 9 wherein the digital address word is received at a row address strobe time.

11. The method of claim 9 wherein activating the sense amplifiers at the first time comprises the steps of:

applying a first power supply voltage source to said sense amplifiers at the first time; and applying a second power supply voltage source to said sense amplifiers at the first time.

12. The method of claim 11 wherein activating the remaining sense amplifiers at times subsequent to the first time comprises the steps of:

applying a first power supply voltage source to said sense amplifiers at times subsequent to the first time; and applying a second power supply voltage source to said sense amplifiers at times subsequent to the first time.

* * * * *